US006852395B2

(12) United States Patent
Dhawan et al.

(10) Patent No.: US 6,852,395 B2
(45) Date of Patent: Feb. 8, 2005

(54) METHODS AND SYSTEMS FOR SELECTIVELY CONNECTING AND DISCONNECTING CONDUCTORS IN A FABRIC

(75) Inventors: Anuj Dhawan, Raleigh, NC (US); Tushar Kanti Ghosh, Raleigh, NC (US); John Muth, Raleigh, NC (US); Abdelfattah Seyam, Cary, NC (US)

(73) Assignee: North Carolina State University, Raleigh, NC (US)

(*) Notice: Subject to any disclaimer, the term of this patent is extended or adjusted under 35 U.S.C. 154(b) by 62 days.

(21) Appl. No.: 10/041,248

(22) Filed: Jan. 8, 2002

(65) Prior Publication Data

US 2003/0129905 A1 Jul. 10, 2003

(51) Int. Cl.[7] .................................................. B32B 7/00
(52) U.S. Cl. ....................... 428/196; 428/198; 442/229; 442/301; 442/377; 442/414
(58) Field of Search ................................. 442/229, 301, 442/414, 377; 428/198, 196

(56) References Cited

U.S. PATENT DOCUMENTS

| | | |
|---|---|---|
| 3,745,287 A | 7/1973 | Walker |
| 3,933,520 A | 1/1976 | Gay et al. |
| 4,091,176 A | 5/1978 | Alfenaar |
| 4,129,677 A | 12/1978 | Boe |
| 4,199,637 A | 4/1980 | Sado |
| 4,247,596 A | 1/1981 | Yee |
| 4,255,973 A | 3/1981 | Karplus |
| 4,267,233 A | 5/1981 | Tanaka et al. |
| 4,308,533 A | 12/1981 | Schmidt |
| 4,350,580 A | 9/1982 | Kadija |
| 4,417,959 A | 11/1983 | Kadija et al. |
| 4,429,179 A | 1/1984 | Chynoweth |
| 4,432,838 A | 2/1984 | Kadija |
| 4,439,303 A | 3/1984 | Cocchi |
| 4,463,323 A | 7/1984 | Piper |
| 4,639,825 A | 1/1987 | Breidegam |
| 4,654,748 A | 3/1987 | Rees |
| 4,661,376 A | 4/1987 | Liang |
| 4,664,158 A | 5/1987 | Sands |
| 4,664,971 A | 5/1987 | Soens |

(List continued on next page.)

OTHER PUBLICATIONS

Unitek Equipment, "Thin–Line(TM) Weld Heads—High Performance, Durability & Long Life 80 Series, 180 Series, 90 Series ," p. 1–8, (Jul., 2001).

(List continued on next page.)

*Primary Examiner*—Elizabeth M. Cole
(74) *Attorney, Agent, or Firm*—Jenkins, Wilson & Taylor, P.A.

(57) ABSTRACT

Methods and systems for selectively connecting and disconnecting conductors in a fabric are disclosed. First and second conductors are integrated into a fabric such that the conductors intersect at a crossover point. The conductors are bonded to each other at the crossover point to improve AC and DC characteristics. Disconnect areas may be provided near the crossover point to allow selective disconnection of the conductors from the crossover point.

20 Claims, 12 Drawing Sheets

U.S. PATENT DOCUMENTS

| | | |
|---|---|---|
| 4,676,561 A | 6/1987 | Barrett, II |
| 4,735,847 A | 4/1988 | Fujiwara et al. |
| 4,743,349 A | 5/1988 | Bachot et al. |
| 4,803,096 A | 2/1989 | Kuhn et al. |
| 4,820,170 A | 4/1989 | Redmond et al. |
| 4,889,963 A | 12/1989 | Onai |
| 4,918,814 A | 4/1990 | Redmond et al. |
| 4,929,803 A | 5/1990 | Yoshida et al. |
| 4,975,317 A | 12/1990 | Kuhn et al. |
| 5,102,727 A | 4/1992 | Pittman et al. |
| 5,162,135 A | 11/1992 | Gregory et al. |
| 5,173,366 A | 12/1992 | Mitamura et al. |
| 5,177,187 A | 1/1993 | MacDiarmid et al. |
| RE34,233 E | 4/1993 | Bachot et al. |
| 5,246,797 A | 9/1993 | Imhof et al. |
| 5,248,468 A | 9/1993 | Mitamura et al. |
| 5,281,171 A | 1/1994 | Job |
| 5,292,573 A | 3/1994 | Adams, Jr. et al. |
| 5,316,830 A | 5/1994 | Adams, Jr. et al. |
| 5,398,547 A | 3/1995 | Gerardi et al. |
| 5,420,465 A | 5/1995 | Wallace et al. |
| 5,624,736 A | 4/1997 | DeAngelis et al. |
| 5,636,378 A | 6/1997 | Griffith |
| 5,689,791 A | 11/1997 | Swift |
| 5,698,148 A | 12/1997 | Asher et al. |
| 5,720,892 A | 2/1998 | DeAngelis et al. |
| 5,776,608 A | 7/1998 | Asher et al. |
| 5,788,897 A | 8/1998 | Hsu |
| 5,802,607 A | 9/1998 | Triplette |
| 5,874,672 A | 2/1999 | Gerardi et al. |
| 5,878,620 A | 3/1999 | Gilbert et al. |
| 5,906,004 A | 5/1999 | Lebby et al. |
| 5,952,099 A | 9/1999 | Asher et al. |
| 6,044,287 A | 3/2000 | Cornell |
| 6,051,335 A | 4/2000 | Dinh-Sybeldon et al. |
| 6,080,690 A | 6/2000 | Lebby et al. |
| 6,120,939 A | 9/2000 | Whear et al. |
| 6,123,883 A | 9/2000 | Mattes et al. |
| 6,145,551 A | 11/2000 | Jayaraman et al. |
| 6,158,884 A | 12/2000 | Lebby et al. |
| 6,210,771 B1 | 4/2001 | Post et al. |
| 6,381,482 B1 | 4/2002 | Jayaraman et al. |

OTHER PUBLICATIONS

Post et al., "E–broidery: Design and Fabrication of Textile–Based Computing," IBM Systems Journal, p. 840–860, (2000).

Gorlick, "Electric Suspenders: A Fabric Power Bus and Data Network for Wearable Digital Devices," The 3rd International Symposium on Wearable Computers, p. 114–121, (1998).

Post et al., "Smart Fabric, or 'Wearable Clothing'," Proceedings of First International Symposium on Wearable Computers, p. 167–168, (1997).

Inaba et al., "A Full–Body Tactile Sensor Suit Using Electrically Conductive Fabric and Strings," Proceedings of the IEEE/RSJ International Conference on Intelligent Robots and Systems, p. 450–457, (1996).

Unitek Equipment, "Unibound II—Advanced Microjoining System," p. 1–4, (Jul., 1995).

Tewksbury, "Interconnections Within Microelectronic Systems," Institute of Electrical and Electronics Engineers, p. 3–49, (1994).

Azoulay, "Anisotropy in Electric Properties of Fabrics Containing New Conductive Fibers," IEEE Transactions on Electrical Insulation, vol. 23 (No. 3), p. 383–386, (1988).

Brews, "Transmission Line Models for Lossy Waveguide Interconnections in VLSI," IEEE Transactions on Electron Devices, p. 1356–1365, (1986).

METHODS AND SYSTEMS FOR SELECTIVELY CONNECTING AND DISCONNECTING CONDUCTORS IN A FABRIC

GOVERNMENT INTEREST

This work was supported by grant number N39998-98-C-3566 from the Department of Defense-Defense Advanced Research Projects Agency (DOD-DARPA). Thus, the U.S. government has certain rights in the invention.

TECHNICAL FIELD

The present invention relates to methods and systems for forming fabric-based electric circuits and/or circuit boards. More particularly, the present invention relates to methods and systems for selectively connecting and disconnecting conductors in a fabric.

BACKGROUND ART

In order to increase the density and flexibility of electric circuits, electric circuits have been formed on non-rigid substrates, such as woven and non-woven fabrics. Exemplary applications for fabric-based electric circuits include communications devices, such as cellular telephones, tactile sensors, biomedical sensors, general purpose computers, etc. In addition, flexible electric circuits, such as fabric-based watches, can be integrated into articles of clothing.

One problem with conventional fabric-based electric circuits is that the electrical resistance of connection points in a fabric varies from one connection point to another. For example, if conductors are woven into a fabric as warp yarns and weft yarns, the space between contact points of the warp and weft yarns varies from one contact point to the next. As a result, uniform resistance between contact points cannot be achieved. In addition, reduced contact between conductors at contact points increases DC resistance and produces undesirable AC characteristics, such as parasitic capacitance and inductance. Thus, there exists a long-felt need for improved methods and systems for selectively connecting and disconnecting conductors in a fabric.

DISCLOSURE OF THE INVENTION

The present invention includes methods and systems for selectively connecting and disconnecting conductors in a fabric. According to one aspect of the invention, first and second conductors are woven into a fabric such that the first and second conductors intersect at a crossover point. Next, heat and/or electrical energy is applied to the first and second conductors at the crossover point. The application of heat and/or electrical energy bonds the conductors at the crossover point and thereby improves both AC and DC characteristics.

Because conductive fibers can be selectively connected and disconnected in a flexible substrate, such as a fabric, the footprint of the circuit board is reduced. For example, a fabric with interconnected conductive fibers can be rolled up and/or folded to increase electrical component density.

According to another aspect of the invention, disconnect areas are provided in conductive fibers woven into a fabric. The disconnect areas may be floats that allow fibers to be selectively disconnected from a crossover point. In another example, the disconnect areas may be electrical, mechanical, or electro-mechanical switches.

Accordingly, it is an object of the invention to provide methods and systems for selectively connecting and disconnecting conductors in a fabric.

It is another object of the invention to provide methods and systems for selectively connecting and disconnecting conductors in a fabric that improve AC and DC signal characteristics.

It is another object of the invention to provide methods and systems for selectively connecting and disconnecting conductors in a fabric that are easily integratable into commercial fabric production processes, such as weaving.

Some of the objects of the invention having been stated hereinabove, other objects will become evident as the description proceeds when taken in connection with the accompanying drawings as best described hereinbelow.

BRIEF DESCRIPTION OF THE DRAWINGS

Preferred embodiment of the invention will now be explained with reference to the accompanying drawings of which.

DETAILED DESCRIPTION OF THE INVENTION

Figure 1:
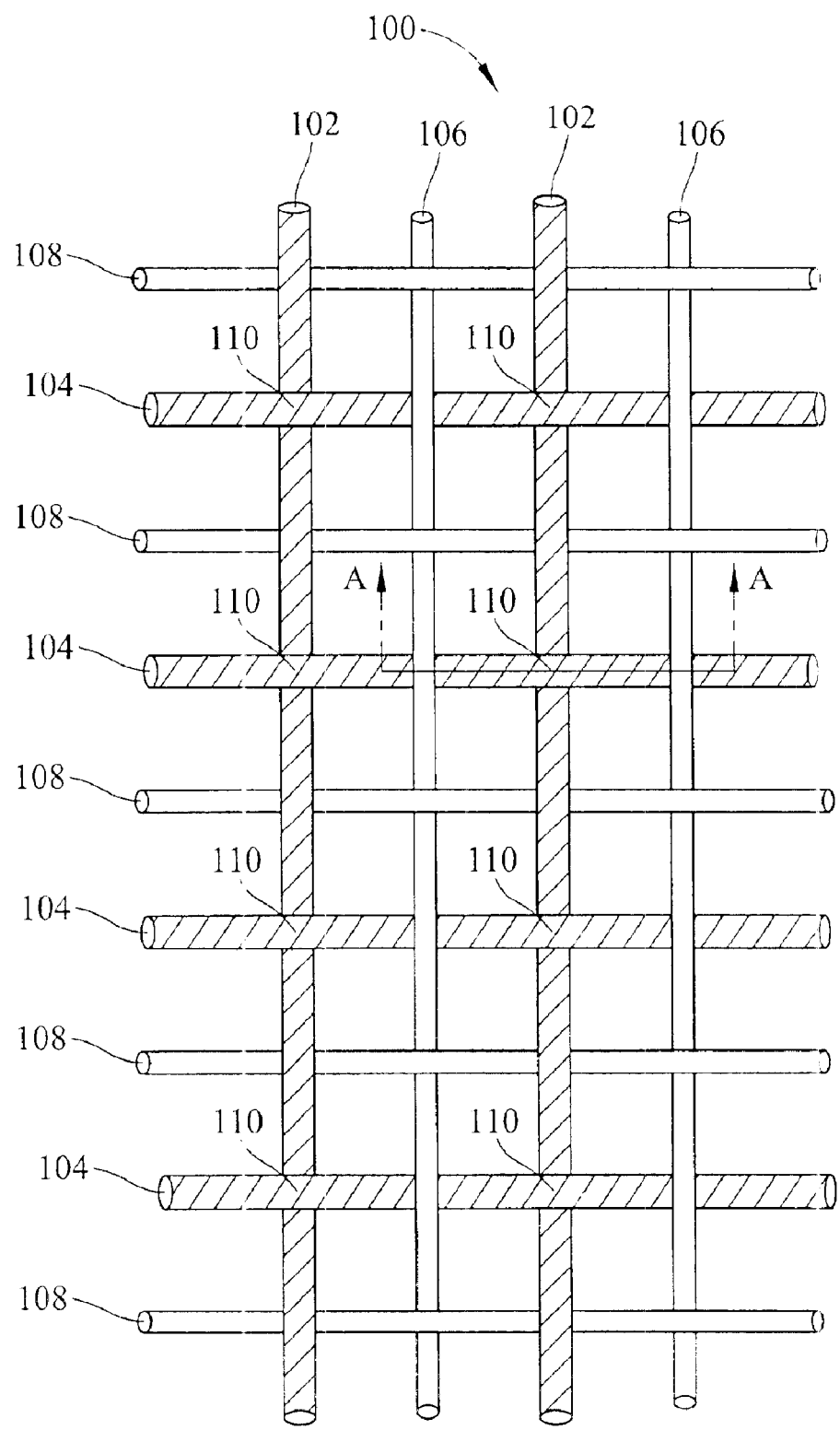
FIG. 1 is a top plan view of a fabric including conductive fibers that are bonded to each other at a crossover point according to an embodiment of the present invention.

FIG. 1 illustrates a fabric including conductive and non-conductive fibers according to an embodiment of the present invention. In FIG. 1, a fabric 100 includes a plurality of conductors 102 and 104 and a plurality of non-conductive fibers 106 and 108. Conductors 102 and 104 may be any type of material capable of conducting an electrical signal. For example, conductors 102 and 104 may be metallic conductors, such as copper, gold, steel, aluminum, silver, or iron. Alternatively, conductors 102 and 104 may be conductive polymers or polymers with conductive coating. Conductors 102 and 104 may be single-wire conductors, coaxial conductors, mono or multi-filament conductive yarn constructions, twisted pair conductors, braided conductors, or any other form of conductor, depending on desired AC and DC characteristics. Non-conductive fibers 106 and 108 may be any type of non-conductive fiber suitable for forming a fabric. For example, non-conductive fibers 106 and 108 may each comprise polyester, polyamide, polyimide, acrylic, modacrylic, rayon, acetate, cotton, spandex, vinyl, or olefin yarns, or any combination thereof.

In the illustrated embodiment, conductors 102 are woven into the fabric as warp yarns, and conductors 104 are woven into the fabric as weft yarns. As such, each conductor 102 intersects each conductor 104 at a crossover point 110. According to an important aspect of the invention, conductors 102 and 104 are bonded to each other at crossover points 110. By "bonded," it is meant that conductors 102 and 104 are joined in a manner to improve AC and DC electrical signal propagation characteristics.

According to a preferred embodiment of the present invention, conductive fibers 102 and 104 may be welded at crossover points 110. Welding conductive fibers 102 and 104 at crossover points 110 greatly improves AC and DC signal characteristics of electric circuits formed using conductive fibers 102 and 104. One exemplary welding method especially suitable for use with metallic fibers is resistance welding. Resistance welding involves adding heat and/or electrical current to conductive fibers 102 and 104 at crossover points 110. The addition of heat and/or electric current melts conductive fibers 102 and 104 at crossover points 110 to form a bond at crossover points 110. Exemplary resistance welding methods suitable for use with embodiments of the present invention will now be discussed in more detail.

Figure 2:
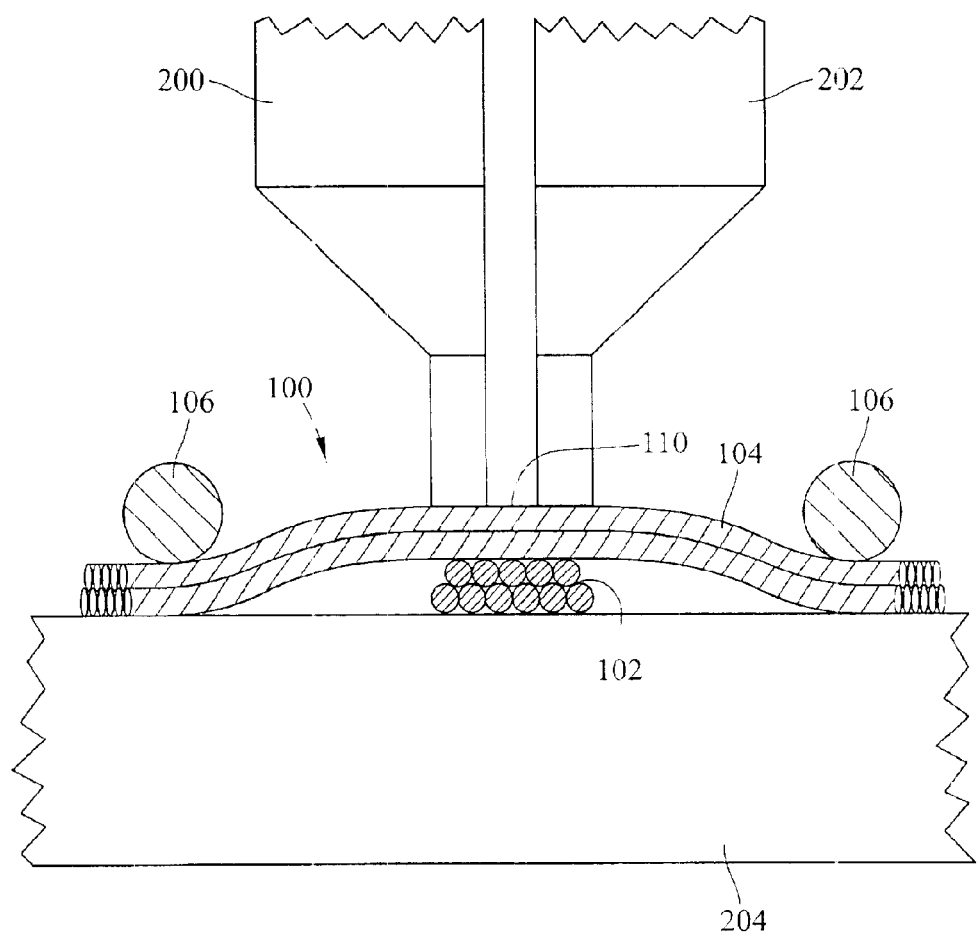
FIG. 2 is a sectional view of fabric 100 taken through line A—A illustrated in FIG. 1 and illustrating parallel probe resistance welding of conductive fibers in a fabric according to an embodiment of the present invention.

One resistance welding method suitable for use in bonding conductors 102 and 104 at crossover points 110 is referred to as parallel probe resistance welding. FIG. 2 is a sectional view of fabric 100 taken along line A—A in FIG. 1 illustrating an exemplary parallel probe resistance welding method used to bond conductive fibers at cross-over points according to an embodiment of the present invention. In FIG. 2, parallel probes 200 and 202 contact conductor 104 at crossover point 110. Fabric 100 is preferably placed on a rigid, non-conductive substrate 204 to facilitate the welding process. Conductive probes 200 and 202 may be any type of conductive probe suitable for resistance welding. One example of conductive probes suitable for use with embodiments of the present invention are the RWMAII UNI-BOND® electrodes available from Unitech Equipment Corporation.

In operation, an electric current is applied to crossover point 110 through conductive probes 200 and 202. In the illustrated example, current flows from probe 200, through conductor 104, through conductor 102, back through conductor 104, and into probe 202. The electric current produces heat which bonds conductors 102 and 104 at crossover point 110. In general, the heat generated in resistance welding can be expressed as:

$$\text{Heat} = I^2 R t K,$$

where I is the weld current through the conductors to be welded, R is the electrical resistance in Ohms of the conductors, t is the time in seconds, milliseconds, or microseconds that current is applied to the conductors, and K is a thermal constant. The weld current I and the duration of the current t are controlled by the resistance welding power supply. The resistance of the conductors R is a function of the force applied by conductive probes 200 and 202 to crossover point 110 and the materials used. The thermal constant K is a function of the geometry of conductors 102 and 104 and the contact pressure applied by conductive probes 200 and 202 to crossover point 110. The bulk and contact resistance values of conductors 102 and 104, probes 200 and 202, and the interfaces between these objects affect the amount of heat generated.

Figure 3:
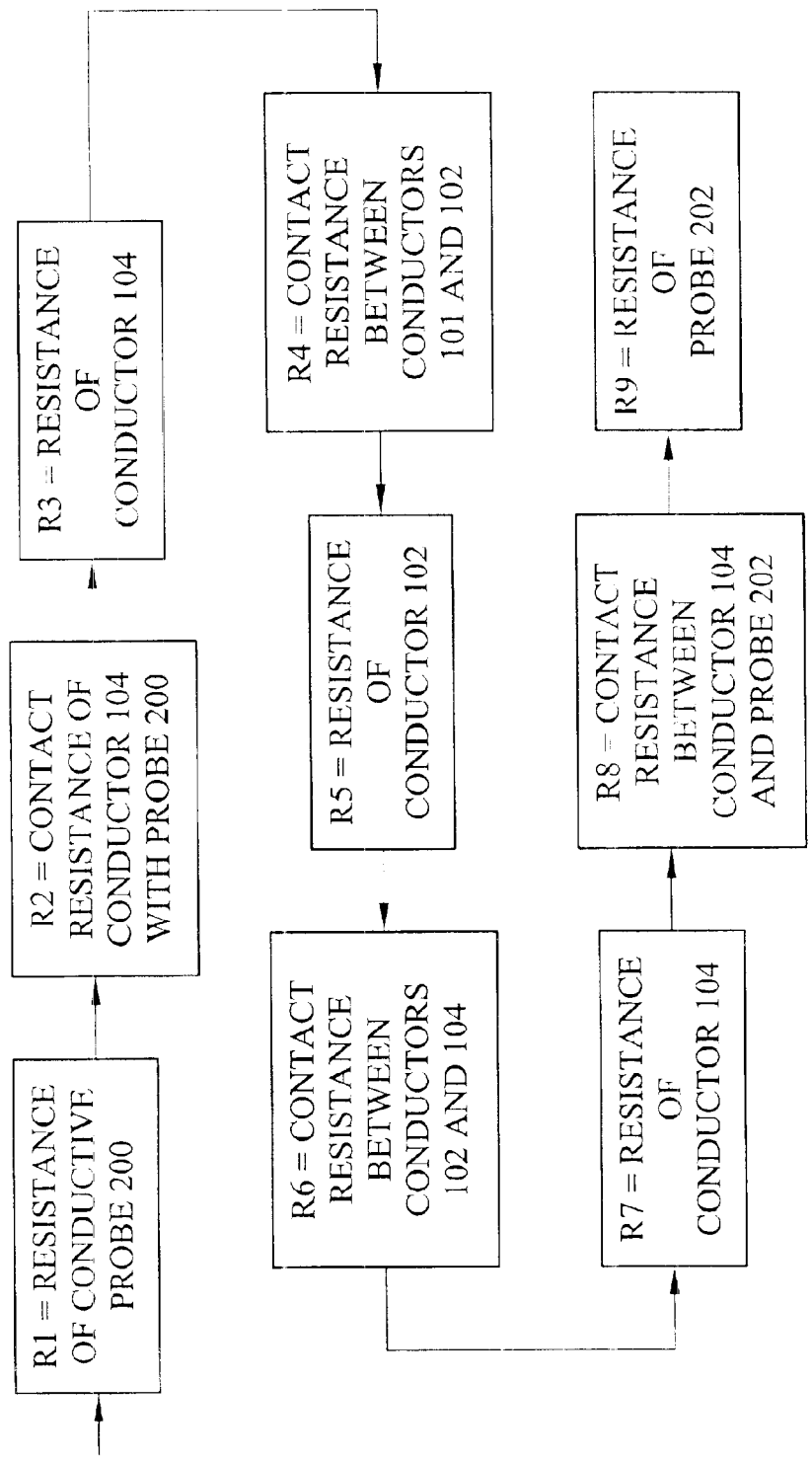
FIG. 3 is a block diagram illustrating resistances associated with applying parallel probe resistance welding to conductors in a fabric according to an embodiment of the present invention.

FIG. 3 illustrates the bulk and contact resistances involved in parallel probe resistance welding conductive fibers in a fabric according to an embodiment of the present invention. In FIG. 3, R1 is the resistance of conductive probe 200 illustrated in FIG. 2. R2 is the contact resistance of conductor 104 with conductive probe 200. R3 is the resistance of conductor 104 along its thickness. R4 is the contact resistance between conductors 104 and 102. R5 is the resistance of conductor 102 through a portion of the cross section of conductor 102. R6 is the contact resistance between conductors 102 and 104. R7 is the resistance of conductor 104 along its thickness. R8 is the contact resistance between conductor 104 and conductive probe 202. Finally, R9 is the resistance of electrode 202. The sum of the resistances yields the total resistance R for the resistance welding process. Thus, by summing the resistances of the various components involved in resistance welding, the amount of current required to be applied to achieve a given heat value can be calculated.

One goal of resistance welding at a crossover point in a fabric containing conductive and non-conductive fibers according to an embodiment of the present invention is to focus the heat generated close to crossover point 110 and avoid damaging non-conductive fibers 106 and 108 that are proximal to crossover point 110. The desired amount of current and desired current application time can be determined by calculating the total resistance as discussed above and determining the desired current and current application time required to melt a given material. Alternatively, optimal weld currents can be determined experimentally. In experiments performed on conductors in a woven fabric, it was determined that a weld current of 1400 Amperes produced the best AC and DC signal characteristics with the least amount of damage to non-conductive fibers.

Figure 4A:
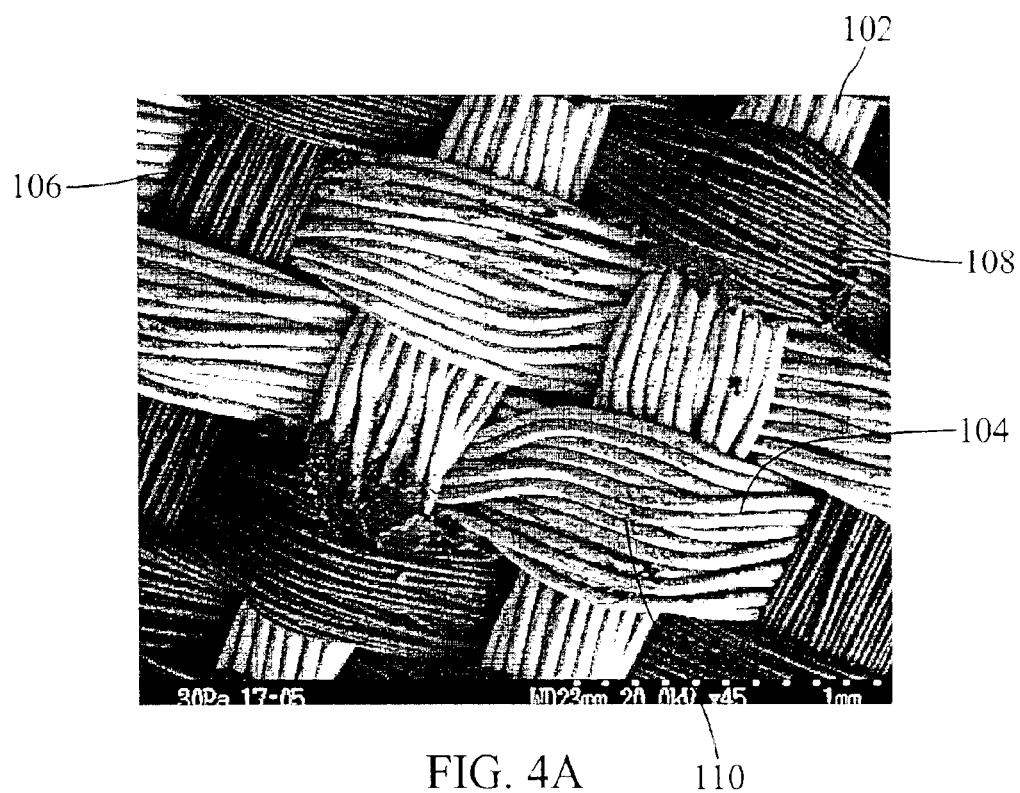
FIGS. 4A and 4B are scanning electron microscope images of resistance welded conductors in a fabric showing bonding of conductors at a crossover point according to an embodiment of the present invention.
Figure 4B:
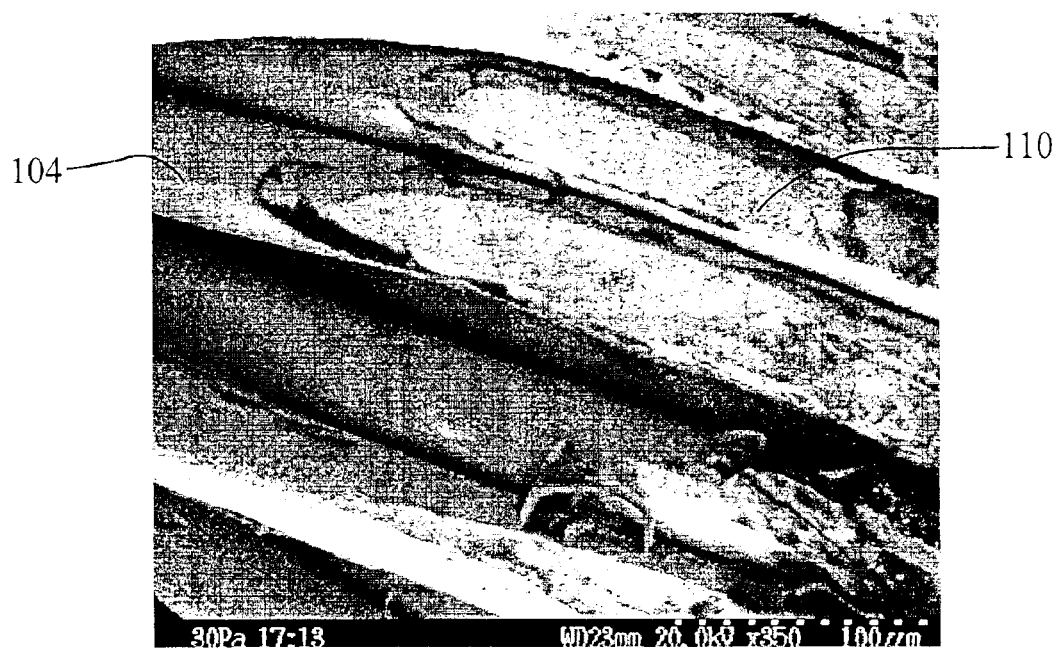

FIGS. 4A and 4B are scanning electronic microscope images of a fabric in which conductive fibers are welded at the crossover point. In FIG. 4A, conductive fibers 102 and 104 comprise copper yarn and non-conductive fibers 106 and 108 comprise polyester yarn. Conductive fibers 102 and 104 were welded using resistance welding at crossover point 110. In FIG. 4B, crossover point 110 is melted at the point of contact of the probes. Top bottom probe resistance welding method (described below) is used to produce the weld shown in FIGS. 4A and 4B. It can be seen from FIG. 4A that there is little damage to non-conductive fibers 106 and 108. Accordingly, FIGS. 4A and 4B illustrate that resistance welding is a suitable method for bonding conductors in a fabric.

Figure 4C:
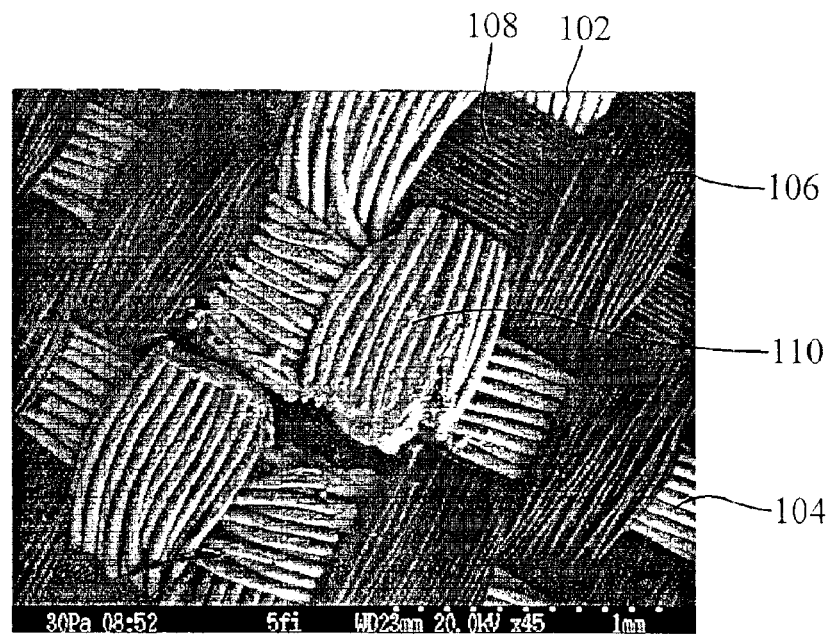
FIGS. 4C and 4D are scanning electron microscope images of conductors in a fabric showing connection and disconnection of the conductors produced by resistance welding according to an embodiment of the present invention.
Figure 4D:
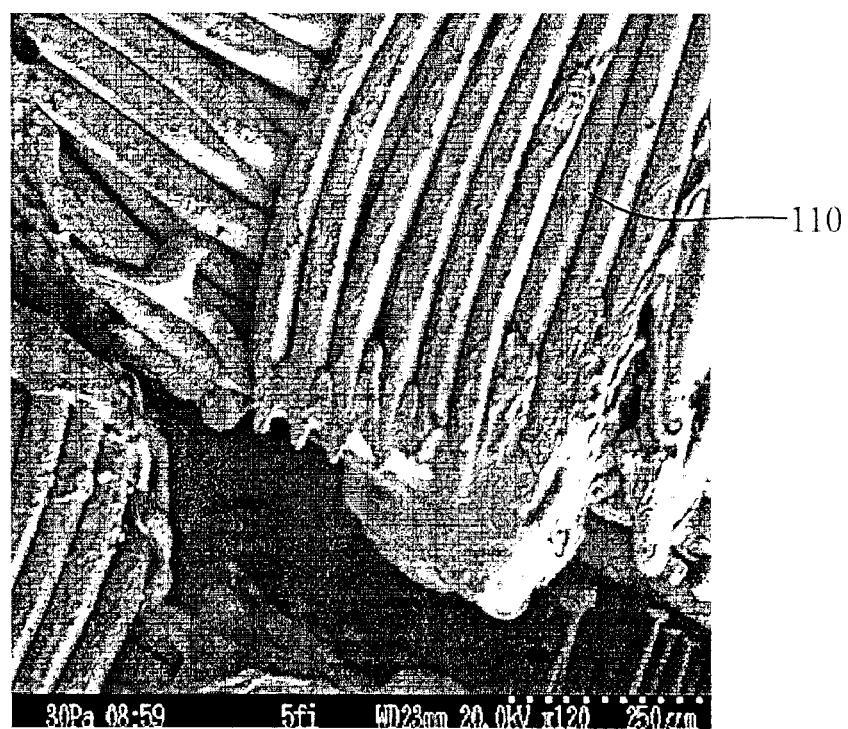

FIGS. 4C and 4D are scanning electron microscope images illustrating a method for forming connections and disconnections between conductors in a fabric according to an embodiment of the present invention. In FIG. 4C, conductor 102 is resistance welded to conductor 104 at crossover point 110. However, conductor 102 is also broken at crossover point 110. The connection and disconnection were formed simultaneously using parallel probe resistance welding, as described above. Thus, according to the present invention, resistance welding can be used to simultaneously connect and disconnect conductors at a crossover point in a fabric. In fact, it was determined that parallel probe resistance welding produced the best bonds with the least amount of damage over the remaining resistance welding techniques described herein.

Figure 5:
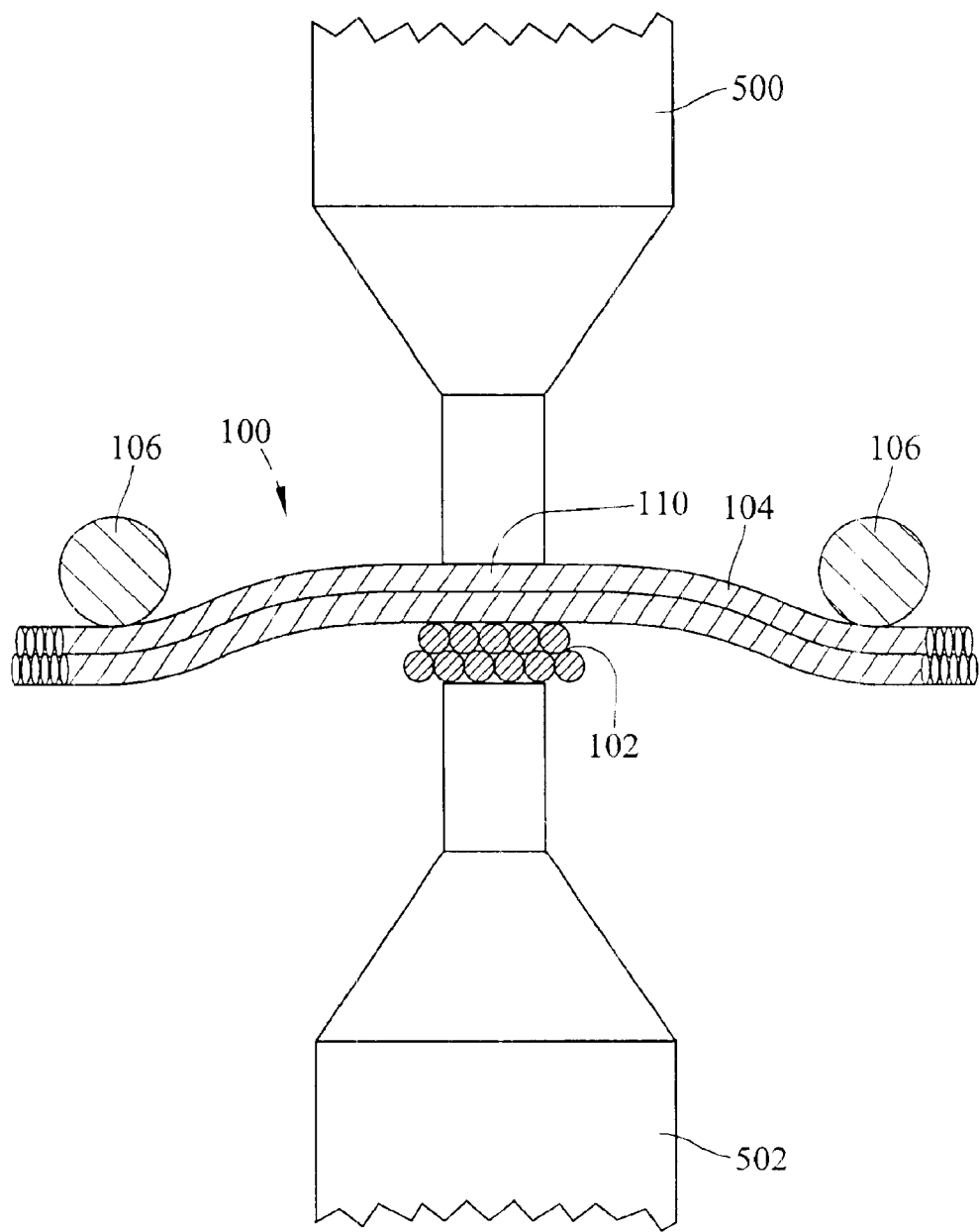
FIG. 5 is a sectional view of fabric 100 taken through line A—A illustrated in FIG. 1 and illustrating top-bottom resistance welding of conductors in a fabric according to an embodiment of the present invention.

Another resistance welding technique suitable for bonding conductive fibers at crossover points according to an embodiment of the present invention is top-bottom resistance welding. In top-bottom resistance welding, one probe is applied to the top side of the material to be welded, and the other probe is applied to the bottom side of the material to be welded. FIG. 5 illustrates an exemplary method for applying top-bottom resistance welding to bond conductors in a fabric according to an embodiment of the present invention. Referring to FIG. 5, one conductive probe 500 is applied to one side of fabric 100 at crossover point 110, and another probe 502 is applied to an opposing side of fabric 100 at crossover point 110. In operation, a power supply supplies a DC current to probe 500. The current flows from probe 500, through conductor 104, through conductor 102, and into probe 502. The heat generated by the current flowing through conductors 104 and 102 melts conductors 104 and 102, thereby bonding conductors 104 and 102 at crossover point 110. The amount and time of current application can be calculated in a similar manner to that described above with regard to parallel probe resistance welding. Like parallel probe resistance welding, top-bottom resistance welding improves AC and DC signal characteristics of conductors in a fabric over non-welded conductors. However, top-bottom resistance welding produced less favorable results than parallel-probe resistance welding.

Yet another resistance welding technique that can be used to bond conductive fibers in a fabric according to an embodiment of the present invention is conductive loop resistance welding. In conductive loop resistance welding, a single loop probe is applied to the material to be welded. A current is applied to the loop to generate heat. The heat generated by the resistance of the loop melts the material to be welded at the point of contact with the loop.

Figure 6:
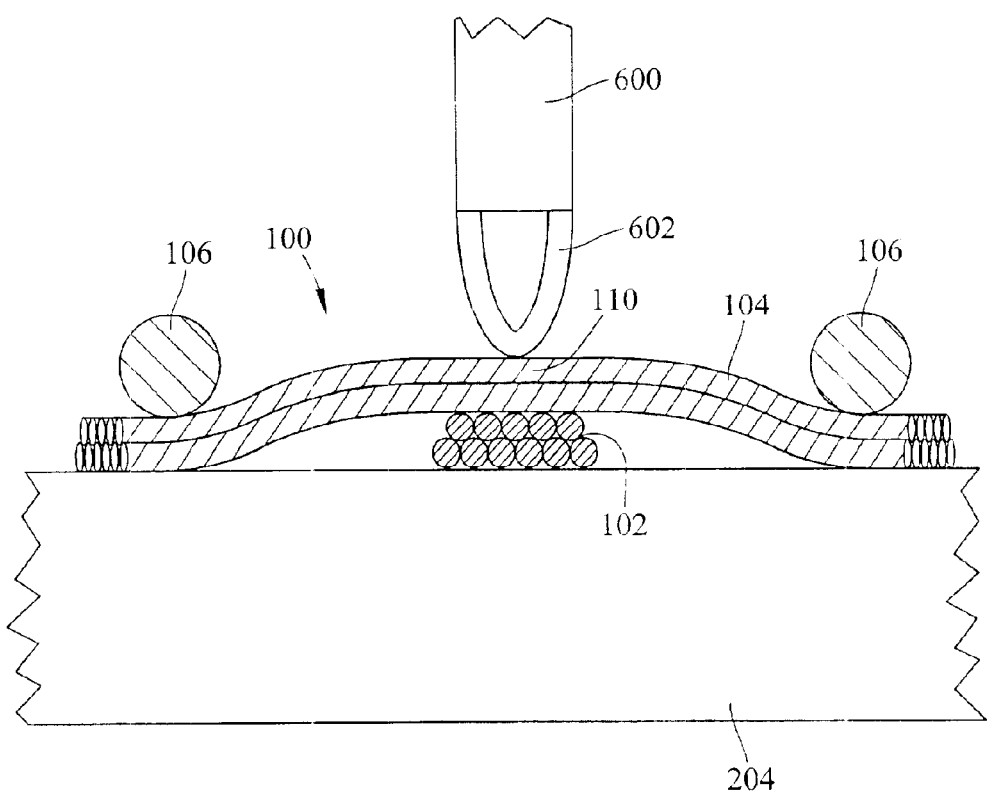
FIG. 6 is a sectional view of fabric 100 taken through line A—A in FIG. 1 and illustrating conductive loop resistance welding of conductors in a fabric according to an embodiment of the present invention.

FIG. 6 illustrates an exemplary method for applying conductive loop resistance welding to join conductors in a fabric according to an embodiment of the present invention. In FIG. 6, conductive probe 600 is a conductive loop probe. In order to join conductors in a fabric at a crossover point, conductive loop probe 600 contacts fabric 100 at each crossover point 110. A current is then generated in loop portion 602 of probe 600. The resistance of loop portion 602 generates heat. The heat, when applied to crossover point 110, melts conductors 102 and 104, causing the conductors to bond at crossover point 110. The bonding at crossover point 110 improves electrical characteristics of circuits formed using conductive fibers 102 and 104, as will be discussed in more detail below.

Figure 7:
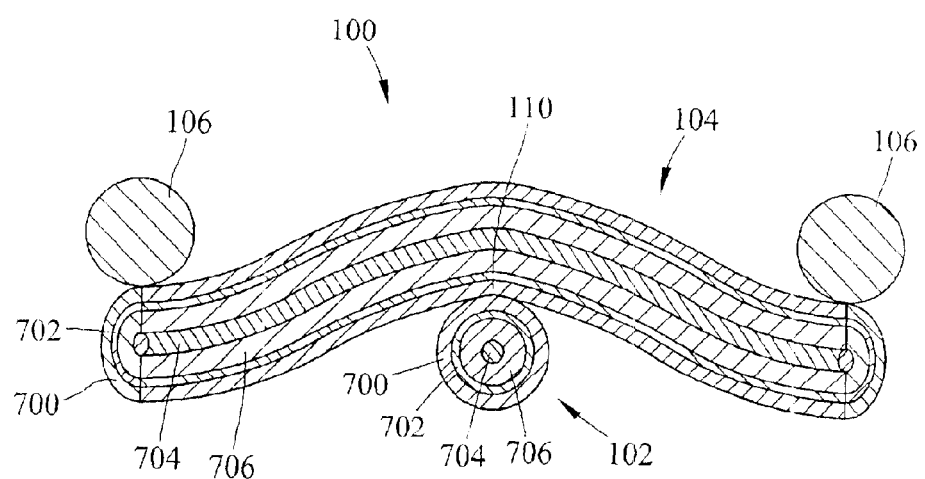
FIG. 7 is a vertical cross-sectional view of coaxial fibers in a fabric that may be bonded at crossover point 110 according to an embodiment of the present invention.

FIG. 7 illustrates a sectional view of fabric 100 in which conductors 102 and 104 are coaxial conductors. In FIG. 7, conductors 102 and 104 each include an outer insulating layer 700, an outer conductor 702, and an inner conductor 704. Region 706 between conductors 702 and 704 may be filled with an appropriate insulating material. In order to interconnect conductive coaxial fibers at crossover points according to an embodiment of the present invention, conductors 702 and 704 are preferably different materials. For example, conductor 702 may be silver and conductor 704 may be copper. Insulators 702 and 706 may be any suitable insulating material, such as polyvinylchloride; rubber; rubber forming polymers, such as polyisoprene, polybutadiene, polychloroprene, and polyisoutylene; polyesters; polyolefins; and/or polyamides.

In most coaxial conductors, the center conductors carry the signal and the outer conductors are connected to ground. Accordingly, in order to design circuitry using coaxial conductors woven into a fabric, it is desirable to bond the inner conductors of the coaxial fibers at the crossover point. In order to bond inner conductor 704 of conductor 104 to inner conductor 704 of conductor 102, a solvent that dissolves insulating layer 700 may first be applied to crossover point 110. Next, a solvent that dissolves outer conductors 702 but not inner conductor 704 is preferably applied to crossover point 110. Next, insulator 706 is preferably dissolved using a suitable solvent. Once insulating layers 700 and 706 and outer conductors 702 are dissolved, inner conductors 704 can be bonded in any suitable means, for example, using any of the resistance welding techniques described above with respect to FIGS. 1 through 6. Thus, embodiments of the present invention include fabrics with coaxial conductors bonded at crossover points 110.

Figure 8:
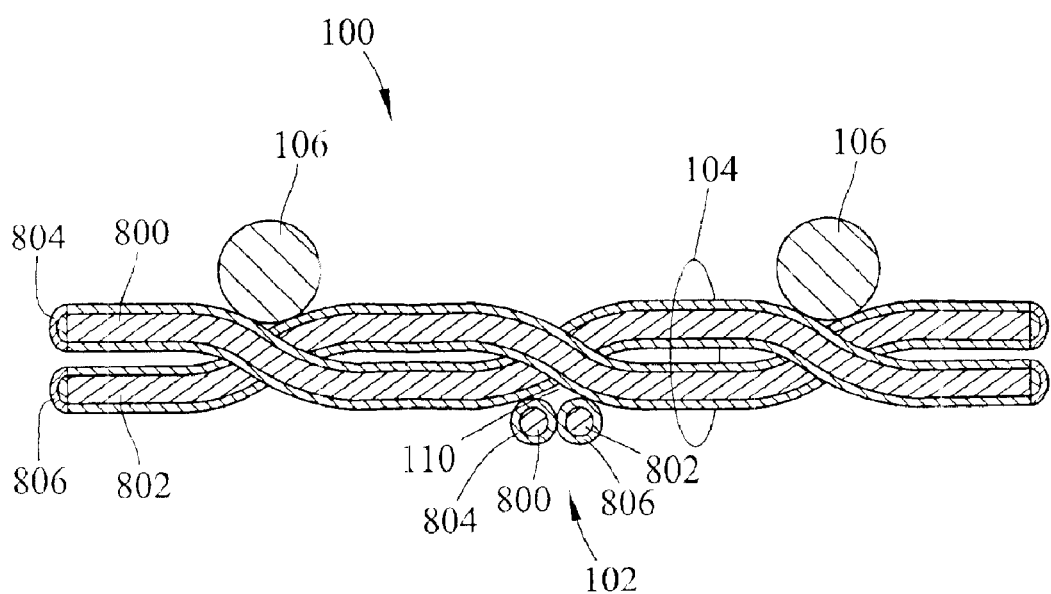
FIG. 8 is a vertical cross-sectional view of twisted pair conductors in a fabric that may be bonded at crossover point 110 according to an embodiment of the present invention.

FIG. 8 illustrates a fabric 100 in which conductors 102 and 104 comprise twisted pair conductors. In FIG. 8, each twisted pair conductor includes a first conductor 800 and a second conductor 802. Each conductor 800 is surrounded by an insulator 804. Each conductor 802 is encapsulated within an insulating layer 806. Conductors 800 and 802 are preferably made of different materials. Similarly, insulators 804 and 806 are preferably made of different material. For example, conductor 800 may be silver and conductor 802 may be copper. Similarly, insulating material 804 may be polyvinylchloride and insulating layer 806 may be rubber; rubber forming polymers, such as polyisoprene, polybutadiene polychloroprene, and polyisoutylene; polyesters, polyolefins; and/or polyamides.

In twisted pair transmission lines, one conductor may function as a signal conductor and the other conductor may be connected to ground. Accordingly, in order to design circuits using twisted pair conductors in a fabric, it is preferable to interconnect at least the signal conductors at crossover points 110. In FIG. 8, it is assumed that conductors 800 are the signal conductors. In order to join conductors 800, a first solvent is preferably applied to crossover point 110 to dissolve insulating layers 804. The solvent preferably does not dissolve insulating layer 806. Next, conductors 800 may be bonded at crossover points 110 using any of the resistance welding techniques described above with regard to FIGS. 1 through 6. Ground conductors 802 may be joined in a similar manner at different crossover points. For example, in order to join ground conductors 802, a solvent that dissolves insulating layer 806 may be applied to crossover point 110. Next, ground conductors 806 may be welded, as described above.

Although resistance welding is the primary method discussed herein for bonding conductors at crossover points, the present invention is not limited to resistance welding.

Any suitable bonding method may be used. For example, conductors in a fabric may be bonded using ultrasonic welding, laser welding, microwave welding, solvent bonding, conductive adhesive or conductive epoxy.

Figure 9:
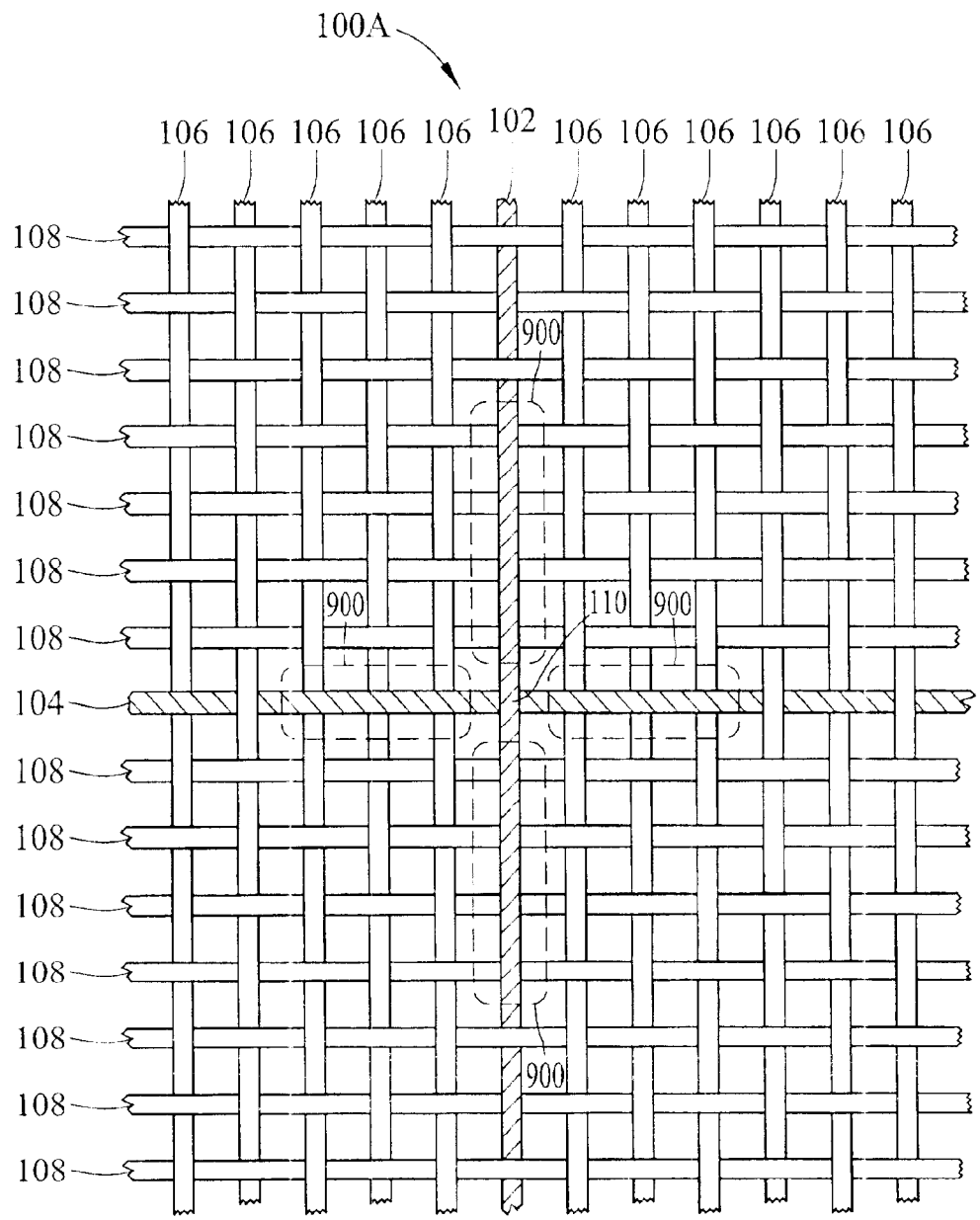
FIG. 9 is a top plan view of a fabric including conductive fibers having disconnect areas comprising floats according to an embodiment of the present invention.

According to another aspect, the present invention includes methods for selectively disconnecting conductive fibers in a fabric. FIG. 9 illustrates a plain woven fabric 100A. In FIG. 9, plain woven fabric 100A includes conductors 102 and 104 and nonconductive fibers 106 and 108. Conductive fibers 102 and 104 intersect at crossover point 110. Conductive fibers 102 and 104 are preferably bonded at crossover point 110. This bonding may be accomplished using any of the above described techniques.

According to an important aspect of the invention, conductive fibers 102 and 104 include disconnect areas 900 that allow selective electrical disconnection from crossover point 110. In the illustrated example, disconnect areas 900 are floats in fabric 100A. Providing floats in fibers 102 and 104 allows conductors 102 and 104 to be selectively cut and hence disconnected from crossover point 110. In a fabric including a plurality of conductive fibers, every crossover point may be bonded at manufacturing time. Disconnect areas 900, which may be floats, switches, or other types of disconnect areas, may be provided at each crossover point. Desired electric circuits may then be formed by selectively cutting conductive fibers 102 or 104 at specific crossover points.

Figure 10:
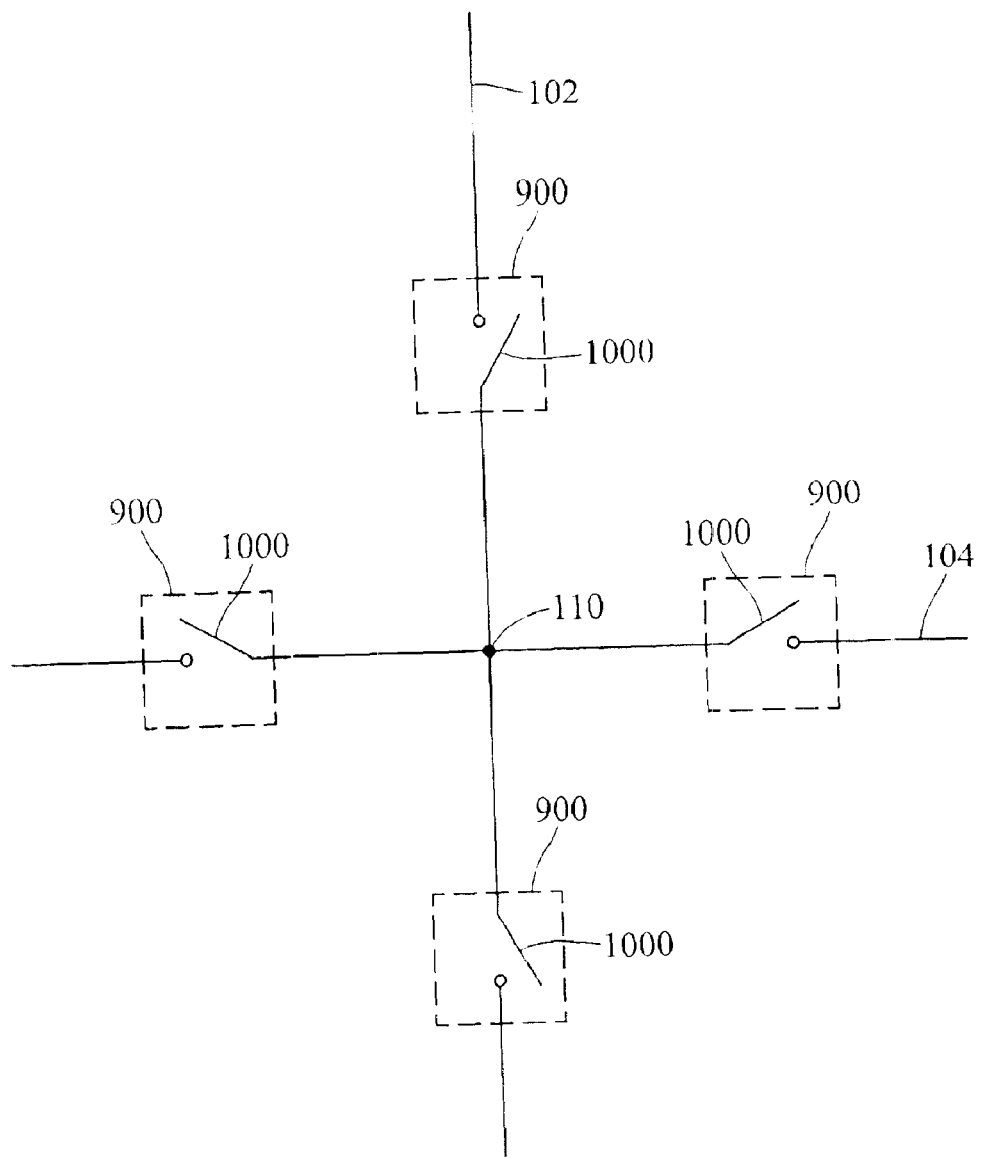
FIG. 10 is a schematic diagram of disconnect areas comprising switches in a fabric according to an embodiment of the present invention.

The present invention is not limited to providing floats in conductive fibers in a fabric to form disconnect areas. In an alternate embodiment of the invention, floats 900 may be replaced by electrical, mechanical, or electro-mechanical switches. Disconnect areas 900 may comprise electrical, mechanical, or electromechanical switches. FIG. 10 is a schematic diagram of conductors 102 and 104 in which disconnect areas 900 comprise switches. In FIG. 10, each disconnect area 900 comprises a switch 1000. One way for forming switches 1000 is to integrate transistors, such as NPN transistors or MOSFETS, in conductive fibers 102 and 104. If transistors are integrated in conductors 102 and 104, the transistors can be selectively opened and closed to form desired electric circuits. Thus, unlike the embodiment illustrated in FIG. 9 where disconnect areas could only be used to disconnect conductors 102 and 104 from crossover point 110, switches 1000 illustrated in FIG. 10 may be used to both connect and disconnect conductive fibers 102 and 104 and variable programmable circuitry can be constructed as desired.

DC Characteristics

As discussed above, the methods for connecting and disconnecting conductors in a fabric described herein greatly improve both AC and DC characteristics of circuits formed using the crossover points. Desirable DC characteristics that were achieved included reduced resistance over unwelded crossover points and substantially uniform resistance across multiple crossover points.

In one evaluation, copper conductors were welded in a fabric and resistance was measured using a HEWLETT PACKARD 3478A multimeter. In performing the measurements, one multimeter probe was placed on one conductor at a predetermined distance from a crossover point and another multimeter probe was placed on the other conductor at a predetermined distance from point. The resistance values for the welded sample were compared against resistance values for unwelded copper conductors in a fabric. In this example, the weld current applied was 1000 Amperes and top-bottom resistance welding was used.

Tables 1 through 3 shown below illustrate measured resistance values for the welded copper conductors.

TABLE 1

DC Resistance Values for Welded Copper Sample A

| Resistance measured after 4 minutes | Measured Resistance $R_{AB}$ (Ohms) | Contact Resistance (Rc) | Actual Resistance ($R_{AB}$–Rc) |
|---|---|---|---|
| Reading 1 | 0.3297 | 0.267 | 0.0627 |
| Reading 2 | 0.3234 | 0.267 | 0.0564 |
| Reading 3 | 0.3308 | 0.267 | 0.0638 |
| Average | 0.3279 | 0.267 | 0.0609 |

TABLE 2

DC Resistance Values for Welded Copper Sample B

| Resistance measured after 4 minutes | Measured Resistance $R_{AB}$ Ohms | Contact Resistance (Rc) | Actual Resistance ($R_{AB}$–Rc) |
|---|---|---|---|
| Reading 1 | 0.3293 | 0.267 | 0.0623 |
| Reading 2 | 0.3297 | 0.267 | 0.0627 |
| Reading 3 | 0.3342 | 0.267 | 0.0672 |
| Average | 0.3310 | 0.267 | 0.064 |

TABLE 3

DC Resistance Values for Welded Copper Sample C

| Resistance measured after 4 minutes | Measured Resistance $R_{AB}$ (Ohms) | Contact Resistance (Rc) | Actual Resistance ($R_{AB}$–Rc) |
|---|---|---|---|
| Reading 1 | 0.3394 | 0.267 | 0.0724 |
| Reading 2 | 0.3313 | 0.267 | 0.0643 |
| Reading 3 | 0.3313 | 0.267 | 0.0643 |
| Average | 0.3340 | 0.267 | 0.067 |

In Tables 1–3, resistance measurements were taken three times for each sample and averaged. The quantity $R_{AB}$ in Tables 1–3 is the resistance measured by the multimeter including the resistance of the multimeter probes. The resistance Rc in Tables 1 through 3 is the resistance of the multimeter contacts or probes. The actual resistance $R_{AB}$-Rc is the resistance of a circuit formed by a portion of conductor 102 between the multimeter probes, a portion of conductor 104 between the multimeter probes, and a crossover point 110. It can be seen from Tables 1–3 that the average resistance for each of the three samples is substantially uniform, i.e., about 0.06 Ohms.

The data illustrated in Tables 1–3 can be contrasted with the data for unwelded copper samples in Table 5.

TABLE 5

DC Resistance Values for Unwelded Copper Conductors

| Resistance measured after 4 minutes | Measured Resistance $R_{AB}$ (Ohms) | Contact Resistance (Rc) | Actual Resistance ($R_{AB}$–Rc) |
|---|---|---|---|
| Reading 1 | 0.6051 | 0.267 | 0.0627 |
| Reading 2 | 0.5600 | 0.267 | 0.0564 |
| Reading 3 | 0.5500 | 0.267 | 0.0638 |
| Reading 4 | 0.5302 | 0.267 | 0.2632 |
| Average | 0.56132 | 0.267 | 0.29432 |

In Table 5, the average actual resistance of the unwelded copper samples taken over four different readings is 0.29432

Ohms, which is nearly five times the resistance of the welded copper samples. Accordingly, connecting conductive fibers at crossover points achieves substantially lower resistance than simply weaving conductive fibers into a fabric. As a result, electrical power dissipation at crossover points is reduced.

AC Characteristics

In addition to improving DC electrical characteristics, bonding conductors at crossover points also improved AC characteristics. Exemplary improvements in AC characteristics included and reduced parasitic capacitance and inductance over unwelded conductors in a fabric.

Figure 11A:
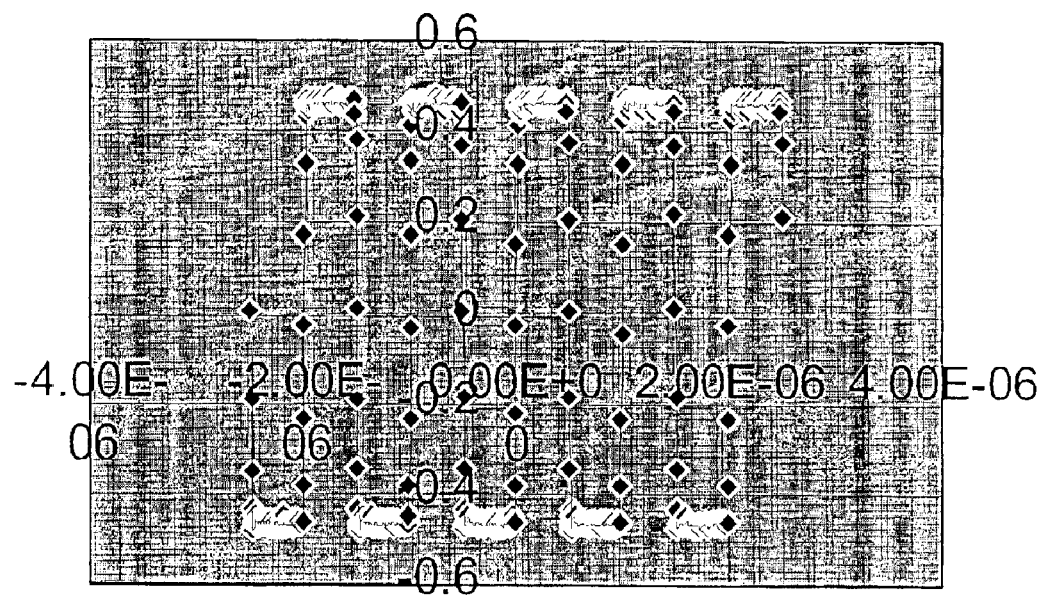
FIGS. 11A and 11B are graphs respectively illustrating AC characteristics and unwelded conductors in a fabric.
Figure 11B:
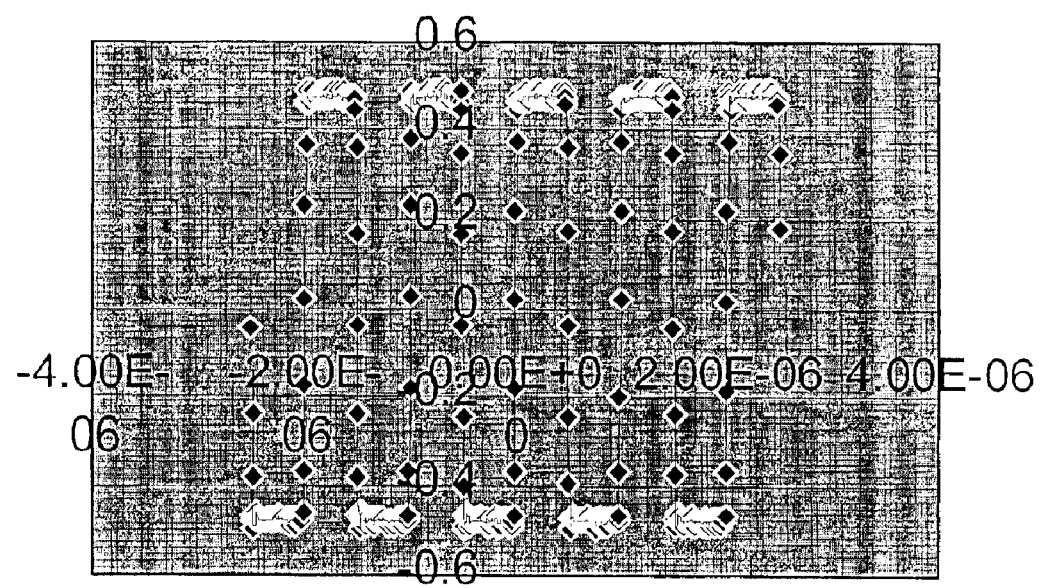

FIGS. 11A and 11B are graphs of voltage in Volts versus time in seconds for welded and unwelded copper conductors in a fabric respectfully. Each sample was excited with a 1 MHz, 1V square wave and the resulting output waveform was measured. It can be seen that each pulse for the unwelded sample illustrated in FIG. 11B has an increased number of peaks and troughs over the welded sample illustrated in FIG. 11A. These peaks and troughs are caused by parasitic inductance and capacitance introduced due to lack of proper bonding at the crossover point. Thus, as is apparent from FIGS. 11A and 11B, bonding conductive fibers at crossover points improves AC characteristics over unbonded samples.

While the examples discussed herein relate to bonding conductors in a woven fabric, the present invention is not limited to connecting and disconnecting conductors in woven fabrics. The methods described herein can be used to connect and disconnect conductors in any type of fabric in which conductors intersect at crossover points, such as knitted fabrics and non-wovens. In addition, the present invention is not limited to connecting and disconnecting conductors in plain woven fabrics. The methods and systems described herein can also be used to bond conductors woven in a fabric in weaves, such as twill weave, basket weave, multilayered fabric weaves, and weaves in three-dimensional fabrics.

It will be understood that various details of the invention may be changed without departing from the scope of the invention. Furthermore, the foregoing description is for the purpose of illustration only, and not for the purpose of limitation—the invention being defined by the claims.

What is claimed is:

1. A fabric including elongated conductors for forming electric circuits, the fabric comprising:
   (a) a plurality of non-conductive fibers;
   (b) a first elongated conductor being integrated in the fabric; and
   (c) a second elongated conductor being integrated in the fabric in a direction that intersects the first conductor, the second conductor intersecting and being bonded to the first conductor through application of at least one of heat and electrical energy to at least one of the first and second conductors at a cross-over point.

2. The fabric of claim 1 wherein the first and second conductors comprise metallic conductors.

3. The fabric of claim 1 wherein the first and second conductors comprise a twisted pair conductors.

4. The fabric of claim 1 wherein the first and second conductors comprise coaxial conductors.

5. The fabric of claim 1 wherein the first arid second conductors comprise conductive polymers.

6. The fabric of claim 1 wherein the first and second conductors are resistance welded to each other.

7. The fabric of claim 1 wherein the first and second conductors are ultrasonically welded to each other.

8. The fabric of claim 1 wherein the first and second conductors are laser welded to each other.

9. The fabric of claim 1 wherein the first and second conductors are chemically bonded to each other.

10. A fabric including elongated conductors for forming electric circuits, the fabric comprising:
    (a) a plurality of non-conductive fibers;
    (b) a first elongated conductor being integrated in the fabric; and
    (c) a second elongated conductor being integrated in the fabric in a direction that intersects the first conductor, the second conductor intersecting and being bonded through application of at least one of heat and electrical energy to the first conductor at a cross-over point, wherein the first conductor comprises a weft yam and the second conductor comprises a warp yarn.

11. A fabric including elongated conductors for forming electric circuits, the fabric comprising:
    (a) a plurality of non-conductive fibers;
    (b) a first elongated conductor being integrated in the fabric; and
    (c) a second elongated conductor being integrated in the fabric in a direction that intersects the first conductor, the second conductor intersecting and being bonded through application of at least one of heat and electrical energy to the first conductor at a cross-over point, wherein at least one of the first and second conductors includes a disconnect area for selectively electrically disconnecting the first and second conductors.

12. The fabric of claim 11 wherein the disconnect area comprises a float formed by at least one of the first and second conductors.

13. The fabric of claim 11 wherein the disconnect area comprises a switch coupled in series with at least one of the first and second conductors.

14. The fabric of claim 1 wherein the fabric is selected from the group consisting of woven, knit and non-woven fabrics.

15. The fabric of claim 1 wherein the first conductor includes a break proximal to the cross-over point, the break being formed through application of at least one of heat and electrical energy to the first conductor.

16. The fabric of claim 1 wherein the application of at least one of heat and electrical energy to at least one of the first and second conductors melts the first and second conductors at the cross-over point to form a bond at the cross-over point.

17. A fabric including elongated conductors for forming electric circuits, the fabric comprising:
    (a) a plurality of non-conductive fibers;
    (b) a first elongated conductor being integrated in the fabric; and
    (c) second elongated conductor being integrated in the fabric in a direction that intersects the first conductor, the second conductor intersecting and being welded to the first conductor at a cross-over point.

18. The fabric of claim 17 wherein the second conductor includes a break proximal to the cross-over point to form a disconnection.

19. The fabric of claim 18 wherein the break is formed using welding.

20. The fabric of claim 19 wherein the welding used to form the break is the same welding used to weld the second conductor to the first conductor at the cross-over point.

* * * * *